United States Patent [19]
Merrill

[11] Patent Number: 5,918,141
[45] Date of Patent: *Jun. 29, 1999

[54] METHOD OF MASKING SILICIDE DEPOSITION UTILIZING A PHOTORESIST MASK

[75] Inventor: Richard B. Merrill, Woodside, Calif.

[73] Assignee: National Semiconductor Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/879,363

[22] Filed: Jun. 20, 1997

[51] Int. Cl.$^6$ .................................................. H01L 21/28
[52] U.S. Cl. ........................................... 438/583; 438/514
[58] Field of Search .................................... 438/306, 533, 438/583, 659, 301, 303, 586, 642, 238, 384, 385, 532, 763, 231, 225, 227, 514

[56] References Cited
U.S. PATENT DOCUMENTS

| | | |
|---|---|---|
| 4,742,025 | 5/1988 | Ohyu et al. . |
| 4,983,536 | 1/1991 | Bulat et al. ................................ 437/40 |
| 5,229,307 | 7/1993 | Vora et al. ................................. 437/31 |
| 5,290,715 | 3/1994 | Pandya ....................................... 438/29 |
| 5,296,386 | 3/1994 | Aronowitz et al. ........................ 437/24 |
| 5,342,798 | 8/1994 | Huang . |
| 5,352,631 | 10/1994 | Sitaram et al. . |
| 5,354,699 | 10/1994 | Ikeda et al. ............................... 437/34 |
| 5,413,969 | 5/1995 | Huang . |
| 5,545,581 | 8/1996 | Armacost et al. ......................... 437/52 |
| 5,576,244 | 11/1996 | Hayashi et al. .......................... 437/200 |
| 5,654,241 | 8/1997 | Kakumu .................................... 438/306 |
| 5,731,239 | 3/1998 | Wong et al. ............................. 438/296 |
| 5,854,101 | 12/1998 | Wu ........................................... 438/231 |

*Primary Examiner*—Charles Bowers
*Assistant Examiner*—Reneé R. Berry
*Attorney, Agent, or Firm*—Limbach & Limbach L.L.P.

[57] ABSTRACT

Problems with forming silicides on the surfaces of silicon structures using traditional oxide masks are overcome by utilizing a photoresist mask. Metal ions are selectively implanted at high dosage and low energy into unmasked surfaces of the silicon structures, where the metal ions react with the silicon to form the desired layer of metal silicide.

12 Claims, 2 Drawing Sheets

METHOD OF MASKING SILICIDE DEPOSITION UTILIZING A PHOTORESIST MASK

BACKGROUND OF THE INVENTION

1. Field of the Invention

The present invention relates to a method of causing the selective formation of silicides upon silicon surfaces, and, more particularly, to a method of masking silicide deposition that utilizes a photoresist mask to block the implantation of silicide metal ions, restricting the formation of silicides to unmasked silicon surfaces.

2. Description of the Related Art

With the increased density of semiconductor devices, the sheet resistivity of the electrically-conducting structures of these devices, such as the gate, drain and source regions of MOS transistors, the emitters of bipolar transistors, the local interconnect regions of MOS and bipolar transistors, and the interconnect lines connecting these devices together, is beginning to limit the speed at which semiconductor devices can operate.

One well-known technique for reducing the sheet resistivity of silicon structures is to form a layer of metal silicide over the silicon structure. The resulting silicided structures provide the lower resistivity of a metal silicide along with the well-known attributes of silicon.

Formation of silicided structures is generally limited to semiconductor devices performing as digital circuits. Where linear circuits are present, introduction of metal silicide layers can degrade signal integrity. Therefore, in forming semiconductor devices having both digital and linear circuits on the same substrate, it is necessary to protect linear circuits from exposure to silicide-forming metals.

The conventional method for selectively applying silicides to surfaces of semiconductor devices utilizes an oxide mask. The oxide mask is deposited upon the entire surface of the device. Portions of the oxide mask are then selectively etched, exposing surfaces upon which silicide is to be formed. A silicide-forming metal is then sputtered upon the entire device, with silicide layers created only on those surfaces selectively etched.

One drawback to the conventional formation of silicided structures using oxide masking is that silicon oxide also forms several important and delicate components of semiconductor devices. For instance, in FIG. 1A, gate spacers 6 and field oxide structures 3 of the NMOS semiconductors 2 are composed of silicon oxide Because of the extremely small size of the gate spacer and field oxide structures, imprecise etching of the mask oxide can easily damage or destroy them. For example, overetching of the gate spacer can cause shorting between the gate region and the source or drain component. Overetching of the field oxide can cause leakage of current to the surrounding silicon structures. Either of these effects can disable the semiconductor device.

SUMMARY OF THE INVENTION

The present invention provides an alternative method for selectively forming a layer of metal silicide upon a semiconductor device that reduces or eliminates limitations found in conventional fabrication processes.

In one embodiment of the present invention, the method begins with formation of a semiconductor device by conventional means. A layer of photoresist is then selectively formed over the surfaces sought to be shielded from silicide formation. Next, silicide-forming metal ions are applied at high doses and low energies to all surfaces. The implanted silicide-forming metal ions react with unmasked silicon to form the silicide. However, these silicide-forming metal ions are blocked by the photoresist material, and no metal implantation occurs in regions bearing the photoresist mask.

After implantation and the formation of silicides, the photoresist is removed, and the process continues with conventional back-end processing steps.

A better understanding of the features and advantages of the present invention will be obtained by reference to the following detailed description and accompanying drawings which set forth an illustrative embodiment in which the principles of the invention are utilized.

DETAILED DESCRIPTION

FIGS. 1A–1E show cross-sectional drawings illustrating the traditional method for masking suicides upon semiconductor devices.

Figure 1A:
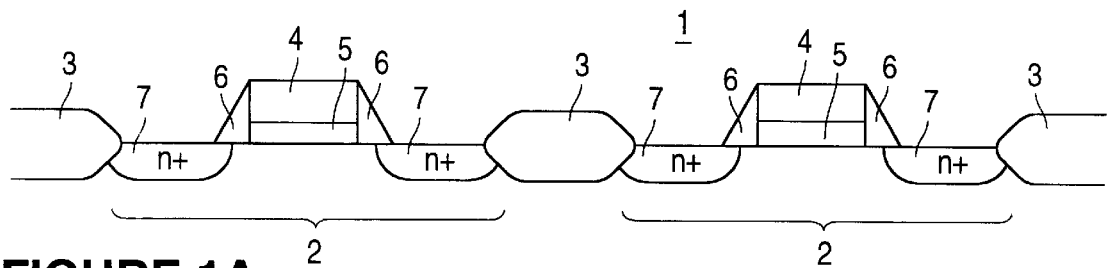
FIGS. 1A–1E are cross-sectional drawings illustrating a conventional process for formation of a MOS semiconductor structure having silicided regions.

The process begins with conventional formation of a semiconductor device having component structures. As shown in FIG. 1A, semiconductor device 1 consists of a series of NMOS transistors 2 isolated from each other by field oxides 3. Each NMOS transistor 2 includes a gate 4, a gate oxide 5, gate spacers 6, and drain/source regions 7. Drain/source regions 7 are interchangeable for each NMOS transistor depending upon the direction of current flow.

Figure 1B:
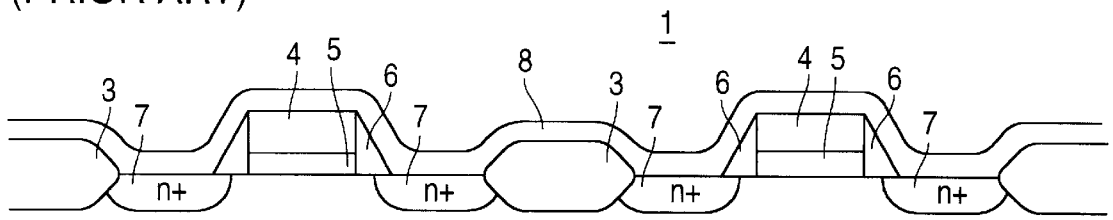

FIG. 1B shows the formation of conventional silicon oxide mask 8 upon all surfaces of semiconductor device 1.

Figure 1C:
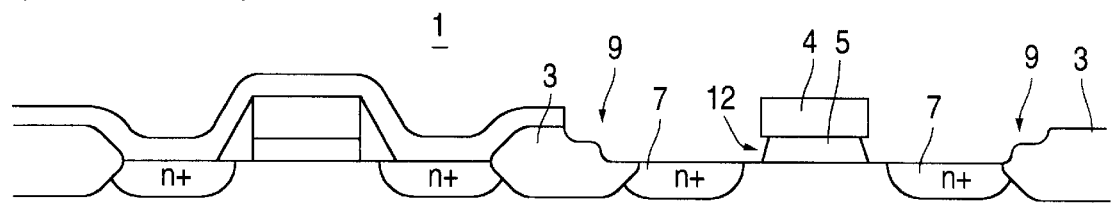

FIG. 1C shows etching of the silicon oxide mask in selected regions to expose regions upon which a silicide layer is intended to be formed. Typically, a layer of silicide is to be formed on the gate, drain, and source regions. FIG. 1C also depicts unintended etching of portion 9 of field oxide 3, and the entirety of gate spacers 6.

Figure 1D:
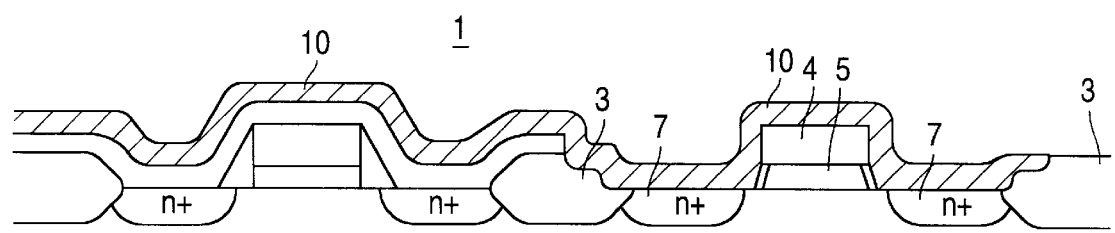

FIG. 1D shows the deposition by sputtering of the silicide metal 10 upon all surfaces of the semiconductor device.

Figure 1E:
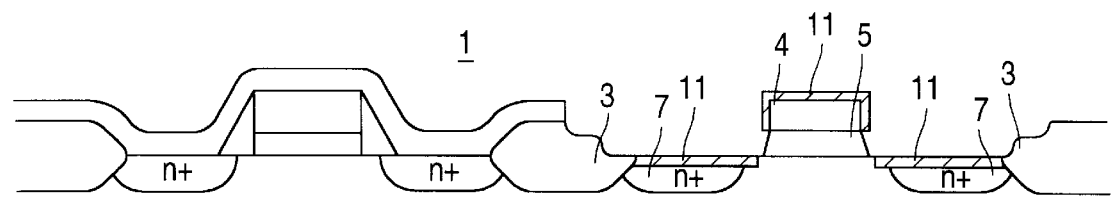

FIG. 1E shows the reaction of the exposed silicon of gate 4 and drain/source regions 7 to form silicide layer 11 followed by the removal of unreacted silicide metal from the oxide surface. Because silicide metals typically have little or no reaction with silicon oxide, no silicide is formed upon the masked areas.

As is depicted in FIG. 1C, imprecise etching of conventional oxide mask 8 can result in the destruction of critically important gate spacers 6. The loss of these gate spacers results in silicide being deposited in the overlap region 12 (FIG. 1E), resulting in a possible conductive path between the gate 4 and drain/source 7. The resulting short circuit would render semiconductor device 1 unusable.

FIG. 1C also depicts the degradation of field oxide 3 at region 9. Loss of material from field oxide 3 can limit its ability to electrically isolate NMOS transistor 2 from surrounding structures. Leakage of current due to a weakened field oxide 3 could also render semiconductor device 1 unusable.

The present invention overcomes these problems. FIGS. 2A–D shows cross-sectional drawings illustrating a silicide-forming process in accordance with one embodiment of the present invention.

Figure 2A:
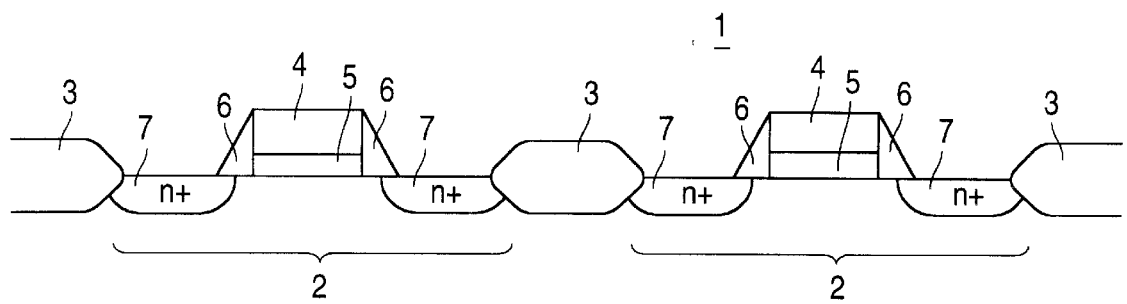
FIGS. 2A–2D are cross-sectional drawings illustrating a process in accordance with one embodiment of the present invention for formation of a MOS semiconductor structure having silicided regions.

The process begins with conventional formation of a semiconductor device having component structures. As shown in FIG. 2A, semiconductor device 1 consists of a series of NMOS transistors 2 isolated from each other by a field oxide 3. Each NMOS transistor includes a gate 4, a gate oxide 5, gate spacers 6, and drain/source regions 7. Drain/source regions 7 are interchangeable for each NMOS transistor depending upon the direction of current flow.

Figure 2B:
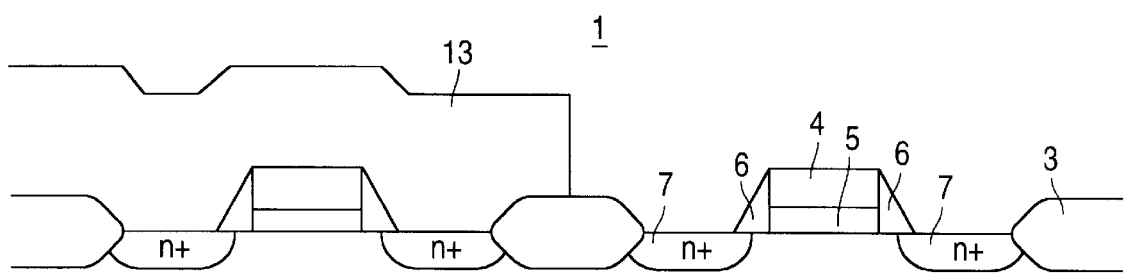

FIG. 2B shows the development of a photoresist mask 13 upon regions to be precluded from the formation of silicides.

Figure 2C:
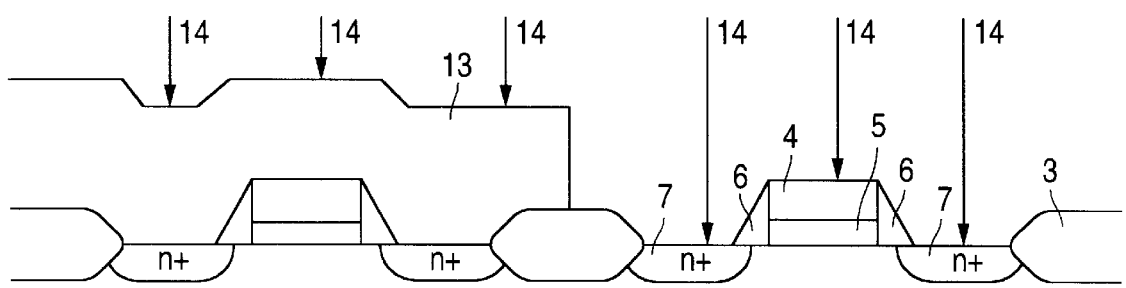

FIG. 2C shows the implantation of silicide-forming metal ions 14. These silicide-metal ions, which can be either Titanium or Cobalt, are implanted with low energies and extremely high dosages. The low energy silicide-forming metal ions are blocked by photoresist 13, ensuring that no metal is implanted into masked areas.

Figure 2D:
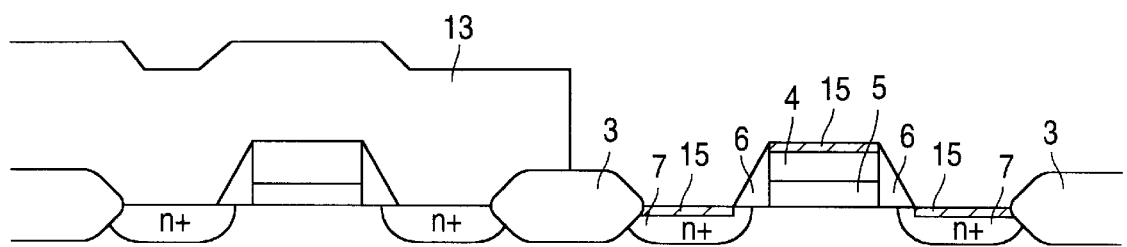

FIG. 2D shows that once the silicide-forming metal ions 14 have been implanted into unmasked areas, the silicon is heated such that these ions react with the silicon to create the desired silicide layer 15. A silicide layer 700 A thick having a stoichiometry of 2:1 can be created using an implantation dose of about $1 \times 10^{17}$ ions/cm$^2$.

Once the silicide layer has been formed, photoresist mask 13 is removed and the semiconductor fabrication process concludes with conventional back-end processing steps.

Implantation energies utilized by the present invention represent perhaps the most advanced implantation technology now available. However, several factors make such implantation feasible for the present invention.

First, the capabilities of ion implant technology are continuing to evolve, and the ability to implant dosages required by the present invention will soon be even more commonplace. Second, because silicide formation is not extremely sensitive to the concentration of implanted silicide-forming metal ions, precise dosimetry is not critical, and other implanter parameters can be relaxed to obtain the necessary higher implantation beam current. Third, while high dosage/low energy ion implantation is currently relatively expensive, the cost of such implantation is expected to decline over time. Each of these factors will enhance the cost-effectiveness of the claimed process over the less expensive, but error prone, oxidation mask techniques currently used.

It is also important to note that semiconductor device 1 shown in FIG. 2A is merely one of many such devices suited for silicide masking in accordance with the present invention. Bipolar transistors and other MOS configured transistors, as well as interconnect lines forming linkages between semiconductor devices, are also suitable for the claimed process. Therefore, it is intended that the following claims define the scope of the invention, and that methods and structures within the scope of these claims and their equivalents be covered thereby.

What is claimed is:

1. A method for forming a layer of metal silicide over a silicon structure of a semiconductor device, the method comprising the steps of:

forming a semiconductor device having a plurality of regions composed of silicon;

applying a photoresistive coating to the semiconductor device, the photoresistive coating defining a first portion of said plurality of silicon regions bearing the photoresistive coating and a second portion of said plurality of silicon regions lacking the photoresistive coating;

implanting a plurality of silicide-forming metal ions such that the photoresistive coating blocks metal ions from penetrating into the first portion of said plurality of silicon regions; and heating the second portion of said plurality of silicon regions such that the silicon and the metal ions react to form silicide.

2. The method of claim 1 wherein the step of implanting a plurality of silicide-forming metal ions includes implanting Titanium.

3. The method of claim 1 wherein the step of implanting a plurality of silicide-forming metal ions includes implanting Cobalt.

4. The method of claim 1 wherein the step of applying a photoresistive coating includes applying a photoresistive coating to define a first portion of said plurality of silicon regions including a linear circuit.

5. The method of claim 1 wherein the step of implanting a plurality of silicide-forming metal ions includes implanting a plurality of silicide forming metal ions with a dosage of at least $1 \times 10^{17}$ ions/cm$^2$.

6. A method for masking silicide deposition comprising the steps of:

applying a photoresistive coating to a silicon surface, the photoresistive coating defining a first plurality of regions of the silicon surface including the photoresistive coating and a second plurality of regions of the silicon surface lacking the photoresistive coating; and implanting a plurality of silicide-forming metal ions such that the photoresistive coating blocks metal ions from penetrating into the first plurality of regions of the silicon surface.

7. The method of claim 6 wherein the step of applying a photoresistive coating includes applying a photoresistive coating to a first plurality of regions of a silicon surface forming a component of a semiconductor device.

8. The method of claim 6 wherein the step of applying a photoresistive coating includes applying a photoresistive coating to a first plurality of regions of a silicon surface forming a linear circuit.

9. The method of claim 6 wherein the step of implanting a plurality of silicide-forming metal ions includes implanting Cobalt.

10. The method of claim 9 wherein the step of implanting a plurality of silicide-forming metal ions includes implanting a plurality of silicide-forming metal ions with a dosage of at least $1 \times 10^{17}$ ions/cm$^2$.

11. The method of claim 6 wherein the step of implanting a plurality of silicide-forming metal ions includes implanting Titanium.

12. The method of claim 11 wherein the step of implanting a plurality of silicide-forming metal ions includes implanting a plurality of silicide-forming metal ions with a dosage of at least $1 \times 10^{17}$ ions/cm$^2$.

* * * * *